United States Patent [19]
Choi et al.

[11] Patent Number: 5,706,438
[45] Date of Patent: Jan. 6, 1998

[54] DATA TRANSMISSION DEVICE FOR TRANSMITTING CONVERTED DATA AT A CONTROLLED TRANSMISSION RATE

[75] Inventors: Hae-min Choi, Kwacheon; Hong-soon Park, Suwon, both of Rep. of Korea

[73] Assignee: Samsung Electronics Co., Ltd., Kyungki-do, Rep. of Korea

[21] Appl. No.: 460,032

[22] Filed: Jun. 2, 1995

[30] Foreign Application Priority Data

Dec. 19, 1994 [KR] Rep. of Korea ............... 94-35082

[51] Int. Cl.$^6$ ................................................ G06F 13/00
[52] U.S. Cl. ............................ 395/200.13; 395/200.19
[58] Field of Search .......................... 395/800, 200, 395/200.13, 200.19, 880, 890, 865, 845

[56] References Cited

U.S. PATENT DOCUMENTS

| | | | |
|---|---|---|---|
| 4,759,014 | 7/1988 | Decker | 370/84 |
| 4,975,913 | 12/1990 | Watanabe | 370/112 |
| 5,127,303 | 7/1992 | Tsumura | 84/609 |
| 5,300,725 | 4/1994 | Manabe | 84/609 |
| 5,454,097 | 9/1995 | Babin | 395/436 |

*Primary Examiner*—Eric Coleman
*Attorney, Agent, or Firm*—Sughrue, Mion, Zinn, Macpeak & Seas, PLLC

[57] ABSTRACT

A data transmission device for converting parallel data into serial data and setting the transmission rate the converted data according to an arbitrary value of time data. The data transmission device includes a first input latch for latching N-bit parallel time data in response to a first input enable signal, and a transmission clock generator for generating a transmission clock signal by counting a system clock signal according to the latched N-bit parallel time data. It also includes a second input latch for latching N-bit parallel transmission data in response to a second input enable signal, and an output selection signal generator for counting the transmission clock signal in response to the second input enable signal and generating the counted value as an output selection signal. Further, the device includes a serial-to-parallel converter for converting the latched N-bit parallel transmission data signal into an (N+2)-bit serial data output signal in response to the output selection signal.

8 Claims, 3 Drawing Sheets

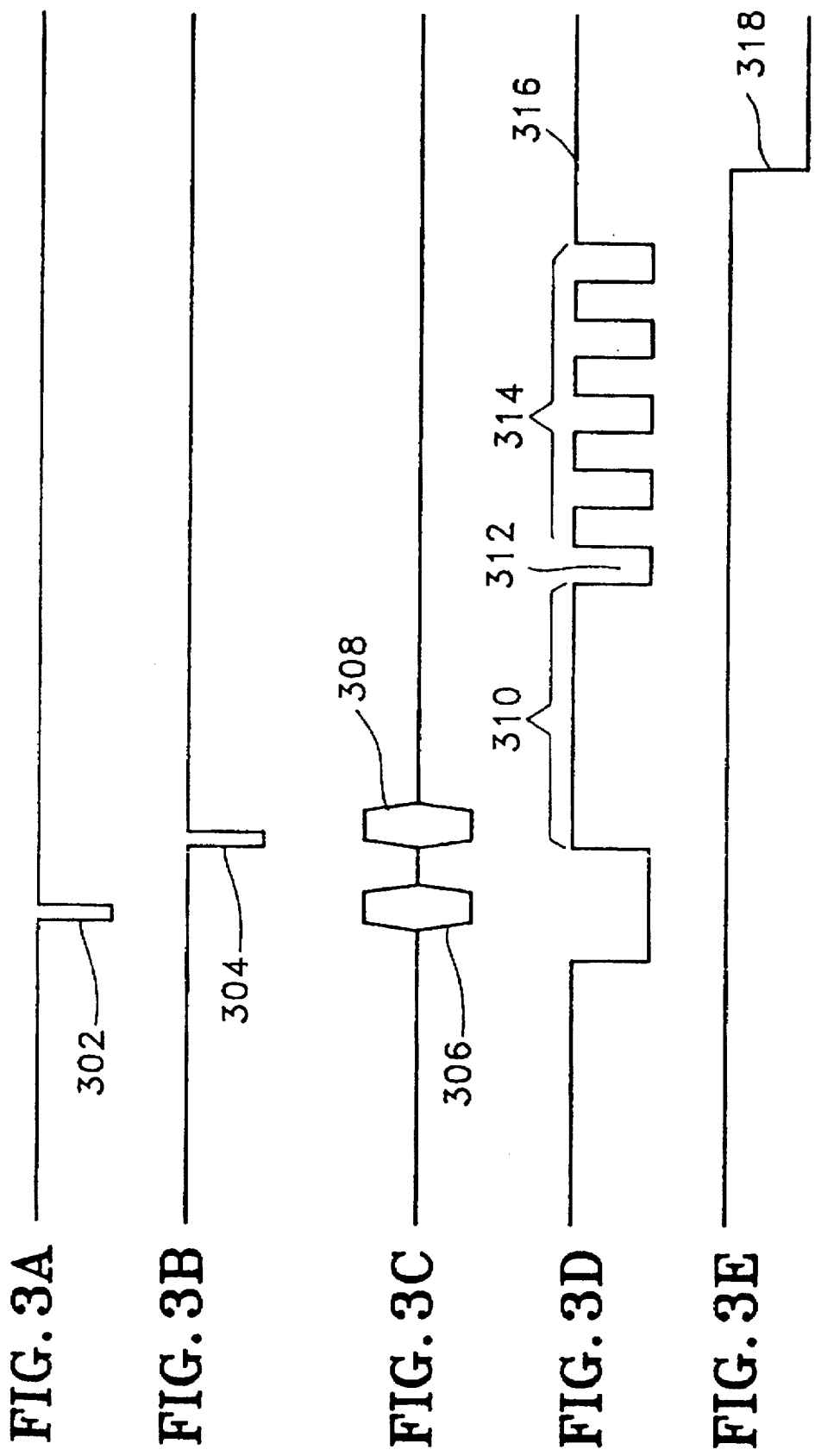

DATA TRANSMISSION DEVICE FOR TRANSMITTING CONVERTED DATA AT A CONTROLLED TRANSMISSION RATE

BACKGROUND OF THE INVENTION

The present invention relates to a data transmission device, and more particularly, to a data transmission device for converting parallel data into serial data and transmitting the converted data at an arbitrary transmission rate.

Generally, a microcomputer processes data as N-bit parallel data for high-speed signal processing. However, the processing speed of a signal processing unit is typically different from that of the microcomputer. Therefore, data buffering is required for data transmission between two processing units having different signal processing speeds.

Accordingly, a universal data transmission integrated circuit (IC) has been introduced for transmitting data between two systems having different processing speeds. The universal data transmission IC may have a bidirectional data transmission function in order to enhance it's universality, but its master signal processing unit still cannot vary the transmission speed via software control. Also, in data transmission applications requiring unidirectional transmission only, such a bidirectional data transmission function is unnecessary.

This is especially true for an application using musical instrument digital interface (MIDI) data, such as a computerized musical instrument, in which a computer outputs MIDI data as 8-bit parallel data at a system clock rate, and an audio source processing unit receives 10-bit serial data and generates sound corresponding to the received MIDI data. Thus, in between the computer and the audio source processing unit, a data transmission device is required for converting the 8-bit parallel data into 10-bit serial data and then transmitting the converted data. Moreover, there has been a need for varying the transmission rate of MIDI data by using a software program, according to the tempo set by the computer.

SUMMARY OF THE INVENTION

To solve the above problems, it is an object of the present invention to provide a data transmission device for converting parallel data into serial data and transmitting the converted data between two systems having different processing speeds.

Accordingly, there is provided a data transmission device comprising: a transmission clock generator for generating a transmission clock signal by counting a system clock signal based on an N-bit parallel time data and a first input enable signal; a output selection signal generator for counting the transmission clock signal in response to a second input enable signal and generating an output selection signal based on a counted value; and a parallel-to-serial convertor for converting an N-bit parallel transmission data into an (N+2)-bit serial data output signal in response to the output selection signal, and outputting the converted signal.

BRIEF DESCRIPTION OF THE DRAWINGS

The above objects and advantages of the present invention will become more apparent by describing in detail a preferred embodiment thereof with reference to the attached drawings in which:

FIGS. 3A, 3B, 3C, 3D and 3E are-views illustrating waveforms at various locations within the circuit shown in FIG. 2.

DETAILED DESCRIPTION OF THE INVENTION

Figure 1:
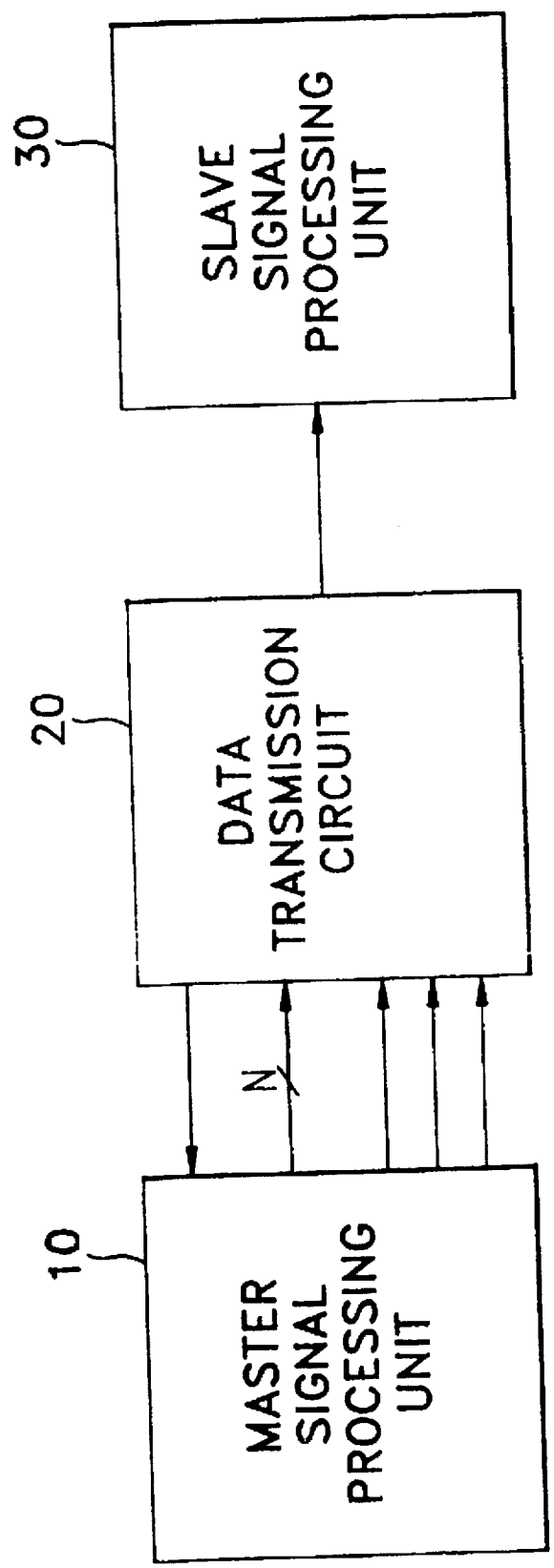
FIG. 1 is a block diagram illustrating a data transmission system according to the present invention.

In FIG. 1, a data transmission system according to the present invention is shown, which includes a master signal processing unit 10, such as a microcomputer, a data transmission circuit 20, and a slave signal processing unit 30, such as a sound source processor. Here, microcomputer 10 outputs an 8-bit parallel data signal, a system clock signal and first and second input enable signals to data transmission circuit 20. Data transmission circuit 20 then transmits a data transmission end signal to microcomputer 10 and a 10-bit serial data signal to sound source processing unit 30.

Figure 2:
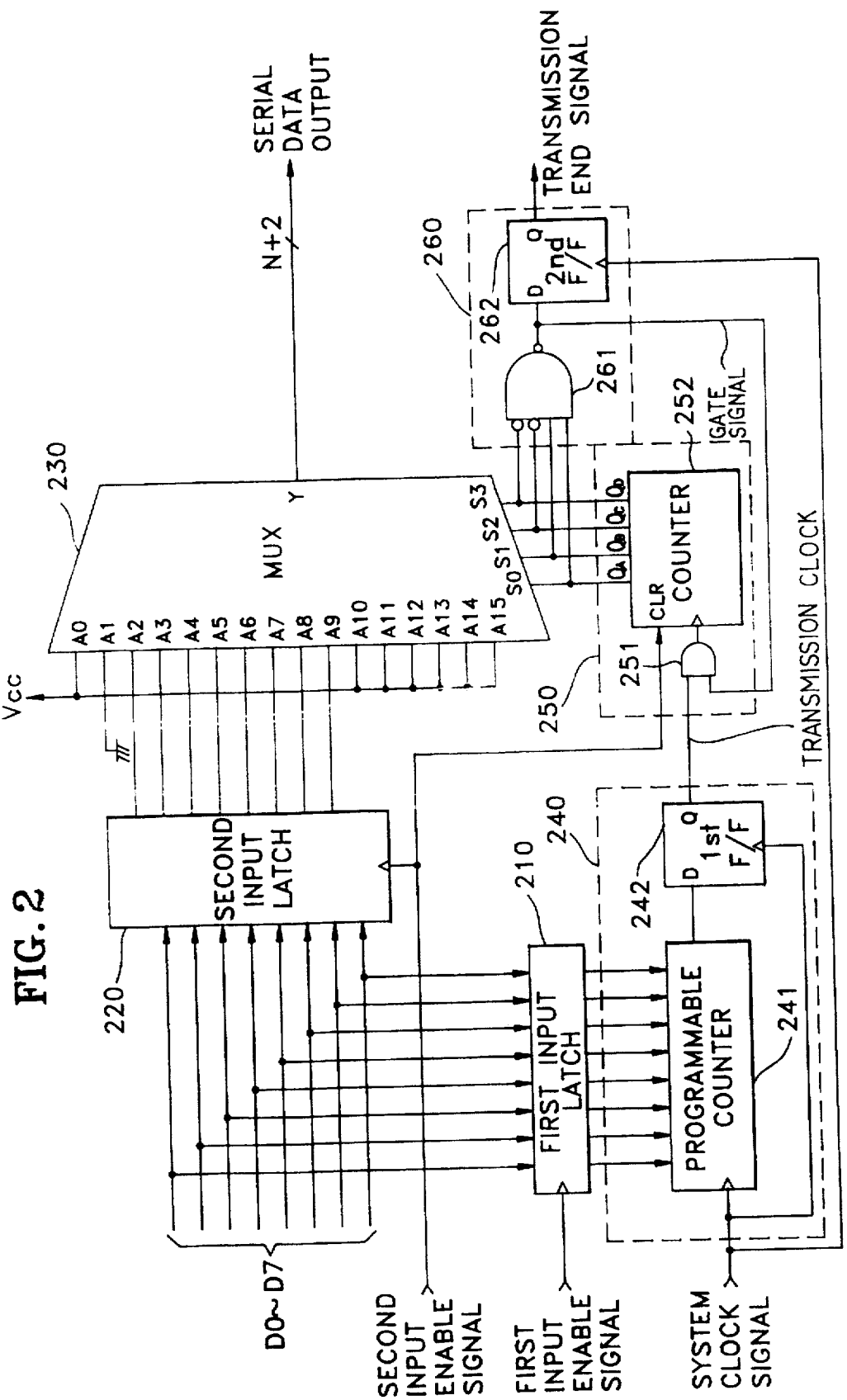
FIG. 2 is a circuit diagram illustrating a data transmission device according to a preferred embodiment of the present invention.

FIG. 2 is a schematic diagram showing a preferred embodiment of the data transmission circuit 20 of FIG. 1. The data transmission circuit 20 includes a first input latch 210 for latching N-bit parallel time data in response to a first input enable signal. Transmission clock generator 240 generates a transmission clock signal by counting the system clock signal based on the time data latched in first input latch 210. A second input latch 220 latches N-bit parallel transmission data in response to a second input enable signal. Output selection signal generator 250 counts the transmission clock signal in response to the second input enable signal and generates the counted value as an output selection signal comprised of four signals $Q_A$, $Q_B$, $Q_C$ and $Q_D$. A parallel-to-serial converter 230 converts the N-bit parallel transmission data signal latched in second input latch 220 into an (N+2)-bit serial data signal in response to the output selection signal, and outputs the converted signal via its output port (Y). Transmission end signal generator 260 generates a transmission end signal and a gate signal in response to the output selection signal from output selection signal generator 250.

Transmission clock generator 240 includes a programmable counter 241 and a first flip-flop 242. Programmable counter 241 counts the system clock signal by using the value latched in first input latch 210 as the initial value in counting. The latched value is again loaded as an initial value when the programmable counter generates a carry signal, thereby programming the output frequency of transmission clock generator 240, based on the time data which is used as the initial count value. First flip-flop 242 synchronizes the carry signal of programmable counter 241, generated after the programmable counter reaches it's maximum count, with the system clock signal and outputs the synchronized carry signal as the transmission clock signal. Thus, the frequency of the transmission clock is based on the latched time data loaded into the programmable counter 241 as the initial value. That is, the smaller the initial value, the lower the transmission clock frequency output from the transmission end signal generator 260.

Output selection signal generator 250 includes a counter 252 and an AND gate 251 for gating the transmission clock signal in response to the gate signal output from the transmission end signal generator 260. Counter 252 is cleared in response to the second input enable signal, and then counts the gated transmission clock signal using a preset value (e.g., 1010) as an initial value. It generates the counted value as an output selection signal (i.e., $Q_A$, $Q_B$, $Q_C$ and $Q_D$). Accordingly, the output of counter 252, that is, the counted value, is generated in order as follows: 1010-1011-1100-1101-1110-1111-0000-0001-0010-0011-0100-0101-0110-0111-1000-1001-1010-1100.

Parallel-to-serial convertor 230 is comprised of a 16-to-1 multiplexer in which a power voltage (Vcc) corresponding to a logical "1" is applied to input ports A0 and A10 through A15, with input port A1 being connected to ground, which corresponds to a logical "0". Parallel-to-serial convertor 230 receives the 8-bit data held in second input latch 220 via input ports A2 through A9, respectively. The output selection signals $Q_A$, $Q_B$, $Q_C$ and $Q_D$ of counter 252 are provided to the multiplexer's selection ports S0 through S3, respectively. One of the input ports, A0 through A15, is selected based on the signal applied to selection ports S0 through S3, and the signal applied to that selected input port is output at port Y.

Transmission end signal generator 260 includes a gate circuit 261 for generating a low level gate signal if the value of the output selection signal is 1100. It also includes a second flip-flop 262 for synchronizing the gate signal with the system clock signal for generating the transmission end signal which is output when the (N+2) bit (i.e., the 10th bit corresponding to the signal input to port A12) is selected and output from port Y.

The following is a description of the operation and effects of the present invention, referring to FIGS. 3A–3E which illustrate the pulse patterns of various parts of the circuit shown in FIG. 2. Here, FIG. 3A shows the first input enable signal, FIG. 3B shows the second input enable signal, FIG. 3C shows the N-bit parallel transmission data, FIG. 3D shows the (N+2)-bit serial data output signal, and FIG. 3E shows the transmission end signal.

In the data transmission circuit 20 of the present invention, the parallel time data 306 on the data bus (D0–D7) shown in FIG. 3C is latched into first input latch 210 at the trailing edge of the first input enable signal 302, shown in FIG. 3A. This latched time data is loaded into programmable counter 241 as its initial value. Programmable counter 241 begins counting and when it reaches its maximum value the next system clock pulse causes programmable counter 241 to generate a carry signal. The carry signal is input to flip-flop 242 and outputs the transmission clock synchronized with system clock. Hence, transmission clock generator 241 generates a transmission clock frequency which is lower than the system clock frequency according to the time data value held in first input latch 210.

Next, at the trailing edge of the second input enable signal 304, shown in FIG. 3B, counter 252 is cleared and the output selection signal is set to its initial value of 1010. Thus, the gate signal goes high (i.e., logical "1"), so that the transmission clock signal is provided to the clock port of counter 252 via AND gate 251, and counter 252 starts counting. Then, parallel transmission data 308, shown in FIG. 3C which is on the data bus (D0–D7) is latched into second input latch 220 and counter 252 starts counting from the initial value of 1010 to 0000, and generates the counted value as the output selection signals $Q_A$, $Q_B$, $Q_C$ and $Q_D$. When the output of counter 252 (i.e., count value) is between 1010 through 0000 inclusive, the output from parallel-to-serial converter 230 stays at a high level 310, as shown in FIG. 3D. When the count value changes to 0001, a logic low start signal 312 is output corresponding to grounded input A1. Subsequently, when the count values are between 0010 through 1001 inclusive, the parallel transmission data 314, as shown in FIG. 3D (e.g., 10101010) which is held in second input latch 220 is sequentially output at port Y. When the count value becomes 1010, an ending signal 316 (converted to a logical "1") is output. Then, when the count value is 1100, the gate signal output from transmission end signal generation means 260 goes low and hence, the supply of the transmission clock signal stops. As a result, the transmission end signal 318 goes low, as shown in FIG. 3E, signalling the end of transmission of the output data.

As described above, the transmission speed of data sent to a slave signal processing unit can be arbitrarily controlled according to time data provided from a master signal processing unit. Thus, the present invention provides convenience in circuit architecture because a user can freely program the transmission speed for practical applications.

While the present invention has been described above according to a preferred embodiment, persons skilled in the art readily understand that other means can be employed to achieve the objects according to the basic teachings set forth herein. For example, down-counters can be employed, with the requisite changes to the logic components to provide the counting functions.

What is claimed:

1. A data transmission device comprising:

a transmission clock generator for generating a transmission clock signal by counting a system clock signal based on an N-bit parallel time data and a first input enable signal;

a output selection signal generator for counting at a rate corresponding to the transmission clock signal rate in response to a second input enable signal and generating an output selection signal based on a counted value; and a parallel-to-serial convertor for converting an N-bit parallel transmission data into an (N+2)-bit serial data output signal in response to the output selection signal, and outputting the convened signal at a transmission rate controlled based on the N-bit parallel time data.

2. A data transmission device according to claim 1, further comprising transmission end signal generator for generating a transmission end signal in response to the output selection signal, when the output selection signal count value corresponds to N+2 bits being convened by said parallel-to-serial convertor.

3. A data transmission device according to claim 1, further comprising:

a first input latch for latching the N-bit parallel time data in response to the first input enable signal; and a second input latch for latching the N-bit parallel transmission data in response to the second input enable signal.

4. A data transmission device according to claim 1, wherein said transmission clock generator comprises:

a programmable counter for counting the system clock signal by loading the value latched in said first input latch as an initial count value and again loading the latched value as an initial count value when a carry signal is generated; and a first flip-flop for synchronizing the carry signal of said programmable counter with the system clock signal and generating the synchronized carry signal as the transmission clock signal.

5. A data transmission device according to claim 1, wherein said output selection signal generator comprises:

an AND gate for gating the transmission clock signal in response to a gate signal; and a counter cleared in response to the second input enable signal, for counting the gated transmission clock signal by using a preset value as an initial count value and generating the counted value as the output selection signal.

6. A data transmission device according to claim 1, wherein said parallel-to-serial convertor is comprised of a 16-to-1 multiplexer.

7. A data transmission device according to claim 2, wherein said transmission end signal generator comprises:

a gate circuit for receiving the output selection signal and generating a gate signal if the received value is a predetermined value; and a second flip-flop for synchronizing the gate signal with the system clock signal to generate the transmission end signal.

8. A data transmission device according to claim 5, wherein said parallel-to-serial convertor is comprised of a 16-to-1 multiplexer which outputs one of the input N-bit parallel transmission data as the converted (N+2)-bit serial data output signal based on the counted value represented by the output selection signal.

* * * * *